(12) United States Patent
Premont et al.

(10) Patent No.: US 9,009,637 B2
(45) Date of Patent: Apr. 14, 2015

(54) METHOD FOR DESIGNING AN ARRAY OF ORGANIC PHOTODETECTOR OR PHOTOEMITTER ELEMENTS

(75) Inventors: Christophe Premont, Sassenage (FR); Romain Gwoziecki, Foulain (FR)

(73) Assignees: Commissariat á l'énergie atomique et aux énergies alternatives, Paris (FR); ISORG, Grenoble (FR)

( * ) Notice: Subject to any disclaimer, the term of this patent is extended or adjusted under 35 U.S.C. 154(b) by 25 days.

(21) Appl. No.: 14/111,370

(22) PCT Filed: Apr. 12, 2012

(86) PCT No.: PCT/EP2012/056679
§ 371 (c)(1),
(2), (4) Date: Dec. 23, 2013

(87) PCT Pub. No.: WO2012/140141
PCT Pub. Date: Oct. 18, 2012

(65) Prior Publication Data
US 2014/0149959 A1    May 29, 2014

(30) Foreign Application Priority Data
Apr. 15, 2011 (FR) ...................................... 11 53311

(51) Int. Cl.
 *G06F 17/50* (2006.01)
 *H04N 5/374* (2011.01)
 *H01L 27/32* (2006.01)
 *H01L 27/30* (2006.01)

(52) U.S. Cl.
 CPC ............ *G06F 17/5077* (2013.01); *H04N 5/374* (2013.01); *H01L 27/3281* (2013.01); *H01L 27/307* (2013.01)

(58) Field of Classification Search
 USPC ......................................................... 716/110
 See application file for complete search history.

(56) References Cited

U.S. PATENT DOCUMENTS

| 3,855,582 | A | 12/1974 | Roberts |
| 2006/0091794 | A1 | 5/2006 | Agostinelli et al. |
| 2011/0069049 | A1* | 3/2011 | Wong et al. ................... 345/205 |

OTHER PUBLICATIONS

International Search Report Issued Jul. 9, 2012 in PCT/EP12/056679 Filed Apr. 12, 2012.
French Preliminary Search Report issued Dec. 6, 2011 in Patent Application No. 1153311 (with English translation of categories of cited documents).
David H.R. Vilkomerson, et al. "A word-organized photodetector array", IEEE Journal of Solid-State Circuits, vol. sc-4, No. 6, Dec. 1969, pp. 317-325.

* cited by examiner

*Primary Examiner* — Eric Lee
(74) *Attorney, Agent, or Firm* — Oblon, Spivak, McClelland, Maier & Neustadt, L.L.P.

(57) ABSTRACT

A method for making a matrix device including a matrix of photodetecting or photoemitting elements, the method including designing operations for: a) identifying, from at least one topology of the matrix device, one or more spurious conducting closed circuits; b) selecting at least one photodetecting or photoemitting element of the matrix device belonging to at least one of the spurious conducting closed circuits identified, the at least one element selected being made inactive.

11 Claims, 9 Drawing Sheets

METHOD FOR DESIGNING AN ARRAY OF ORGANIC PHOTODETECTOR OR PHOTOEMITTER ELEMENTS

TECHNICAL FIELD

The present application relates to the field of matrix microelectronic devices of photodetecting or photoemitting elements, and in particular those formed by passive photodetecting or photoemitting elements.

It provides an improved method for designing a matrix device of photodetecting or photoemitting elements, as well as a matrix device implemented according to such a method.

The present invention is in particular applicable in making matrices of photodetecting or photoemitting elements based on an organic semi-conductor material.

STATE OF PRIOR ART

In an image sensor formed by a matrix of photodetecting elements, the information held by each of the photodetecting elements is generally in the form of a current or voltage.

When a matrix consists of pixels or photodetecting or photoemitting elements, which do not integrate a processing resource located at the pixel itself, these pixels are generally called "passive" pixels.

Currently, image sensors made on silicon, such as charge coupled sensors or CCD (Charge Coupled Device), or CMOS technology sensors are formed by active pixels, that is pixels which, besides the detection function, locally integrate signal processing means, for example means providing a pre-charging and/or amplification or multiplexing function.

Active pixels enable improvements in image quality and reading rate of the sensor to be achieved.

For implementation concern reasons of the manufacturing process, image sensors based on organic photodetectors, that is formed by at least one organic semi-conductor material, are in turn currently formed by passive elements or pixels.

When photodiodes of a matrix of photodiodes are illuminated, the same are in low impedance and create spurious current paths, which can result in preventing a reading of the information held as a current or voltage by each pixel from being performed.

An example of such a phenomenon is illustrated on the device of FIG. 1 giving an equivalent electric circuit of a matrix portion of photodetectors including 2 rows and 2 columns of photodiodes $11_1$, $11_2$, $11_3$, $11_4$.

In this example, the photodiodes of the matrix are reverse biased, such that a given photodiode $11_3$ the current of which is desired to be read, has for example a cathode $15_0$ placed at +1 volt, whereas its anode $17_0$ is for example biased at 0 volt.

Interconnecting resistors 13, biasing electrodes $15_0$, $15_1$, $17_0$, $17_1$, as well as a path $C_a$ of the current intended to be produced by the photodiode $11_3$ and a path $C_p$ of the spurious current passing through the neighbouring or adjacent meshes to that of the pixel desired to be read, are represented in this figure.

In order to solve this problem of spurious conducting circuits and allow an improved reading of a pixel, one method consists in introducing further diodes between the matrix pixels.

Such a method is introduced for example in Documents U.S. Pat. No. 3,855,582 and "a Word-organised photo detector area", Vilkomerson et al. IEEE journal of solid state circuits, vol. sc-4, n° 6, December 1969.

Such a solution is however hardly applicable to matrices based on organic semi-conductor photodetectors, in particular for complexity reasons of the manufacturing process, and in particular implementation complexity of the further diodes between the pixels.

Other solutions to the aforesaid problem which would require to integrate transistors and photodetectors on a same substrate are also hardly applicable to matrices based on organic semi-conductor photodetectors, also for implementation concern reasons.

DISCLOSURE OF THE INVENTION

The invention first relates to a method for making a matrix device comprising a matrix of photodetecting or photoemitting elements or pixels, the method comprising designing steps consisting in:

a) identifying, from at least one given topology (often referred to as "layout") of said matrix device, one or more electrically conducting closed circuits, in particular spurious conducting circuits, b) selecting one or more given photodetecting or photoemitting element(s) of the matrix device belonging to at least one of said conducting closed circuits identified, at least one of said element(s) selected in step b) of the matrix then being made inactive or being identified as intended to be made inactive.

The designing method includes at least one or more designing steps which are computer assisted or performed using data processing means.

The designing steps a) and b) can in particular be computer assisted or performed using data processing means.

The method can further comprise at least one designing step consisting in producing a new topology of said matrix device wherein said at least one element selected in step (b) is made inactive or is identified as intended to be made inactive.

The making method can comprise in step a):

implementing, from said given topology, at least one graph formed by vertices corresponding to said elements of the matrix and links corresponding to connections of said vertices in the matrix, identifying one or more given cycles in said graph.

Step b) can then be performed by selecting at least one given vertex belonging to at least one of said cycles of said graph.

Thus, by using at least one equivalent graph, potential spurious conducting circuits are identified in the given topology, and then one or more given photodetecting or photoemitting elements belonging to this or these circuits are selected, at least one of which is intended to be made inactive.

Said given vertex selected can be common to two cycles of said graph.

It is attempted to minimize the number of elements to be made inactive while choosing elements of the matrix which belong to several spurious conducting circuits.

According to another possibility, said given vertex selected can belong to a cycle having a length higher than a predetermined length or belongs to the greatest cycle of said graph.

It is attempted to minimize the number of elements to be made inactive while choosing elements of the matrix which belong to a spurious conducting circuit having a great size.

The making method according to the invention can further comprise a step consisting in manufacturing said matrix device, wherein said at least one element selected in step b) is inactive.

Said element(s) selected can be made inactive by providing at least one of their electrode(s) not connected to the remainder of the matrix.

Said element(s) selected can also be made inactive by providing a masking zone facing their detecting or emitting semi-conducting zone.

According to another implementation possibility, elements made inactive or intended to be made inactive can be provided, without a detecting or emitting semi-conducting zone, or with an insulating zone replacing the detecting semi-conducting zone.

According to another implementation possibility, the elements can be made inactive by physical or chemical treatment of their photodetecting or photoemitting semi-conducting zone.

The method according to the invention is in particular applicable to making a device wherein the elements of the matrix are organic semi-conductor photodiodes.

The present invention also relates to a device made using a method such as defined above.

The present invention relates to a device formed by a matrix of photodetecting or photoemitting elements, in particular with an organic semi-conductor, wherein one or more elements are inactive.

The invention also relates to a computer program comprising program code instructions recordable onto this computer to execute steps of the designing method such as defined above.

The invention also relates to a computer program product comprising program code instructions recorded onto a medium usable in a computer, comprising readable programming means for implementing a designing method such as defined above.

The invention also relates to a digital data medium usable by a computer, comprising code instructions of such a computer program.

BRIEF DESCRIPTION OF THE DRAWINGS

The present invention will be better understood upon reading the description of exemplary embodiments given by way of purely indicating and in no way limiting purposes, by making reference to the appended drawings wherein.

Identical, similar or equivalent parts in the different figures have the same reference numerals so as to facilitate switching from one figure to another.

Different parts represented in the figures are not necessarily to a uniform scale, for the figures to be more intelligible.

DETAILED DISCLOSURE OF PARTICULAR EMBODIMENTS

An exemplary method according to the invention for making a matrix device formed by a plurality of photodetecting elements will now be described.

In the given example, the elements of the matrix are photodiodes, in particular organic semi-conductor photodiodes.

Making the matrix includes a designing phase during which a first topology commonly called "layout" of the matrix device is implemented.

This first topology includes in particular a routing plan of the matrix components.

From this first topology, at least one first graph is produced. This graph is comprised of nodes or vertices, corresponding to the photodetecting elements, as well as ridges or links representative of a predicted routine plan of the matrix.

According to a possible implementation of the graph, the ridges or links of the graph can be weighted, for example as a function of the resistance value of material used to form the photodiodes and the respective connections thereof.

Figure 1:
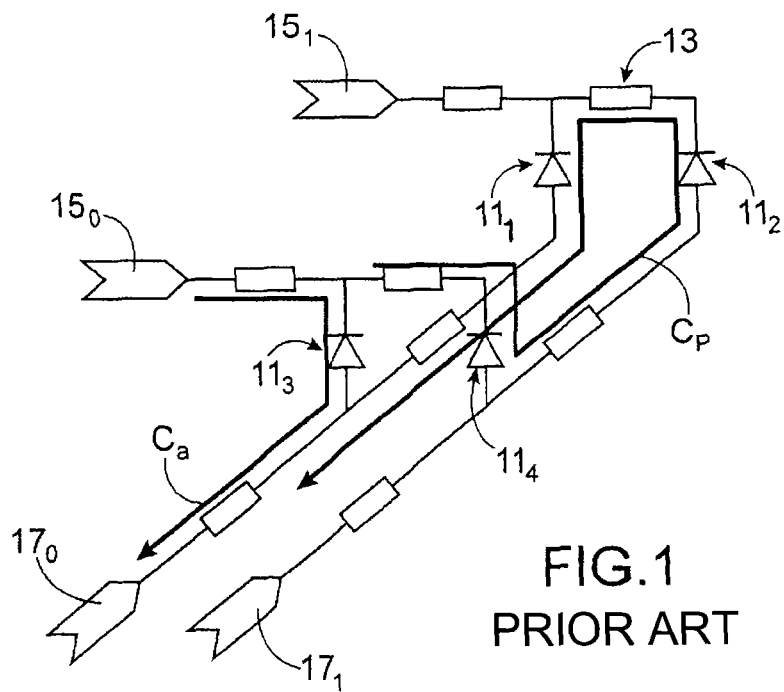
FIG. 1 represents an equivalent electric circuit of a matrix portion of photodiodes wherein a spurious conducting circuit is identified.
Figure 2A:
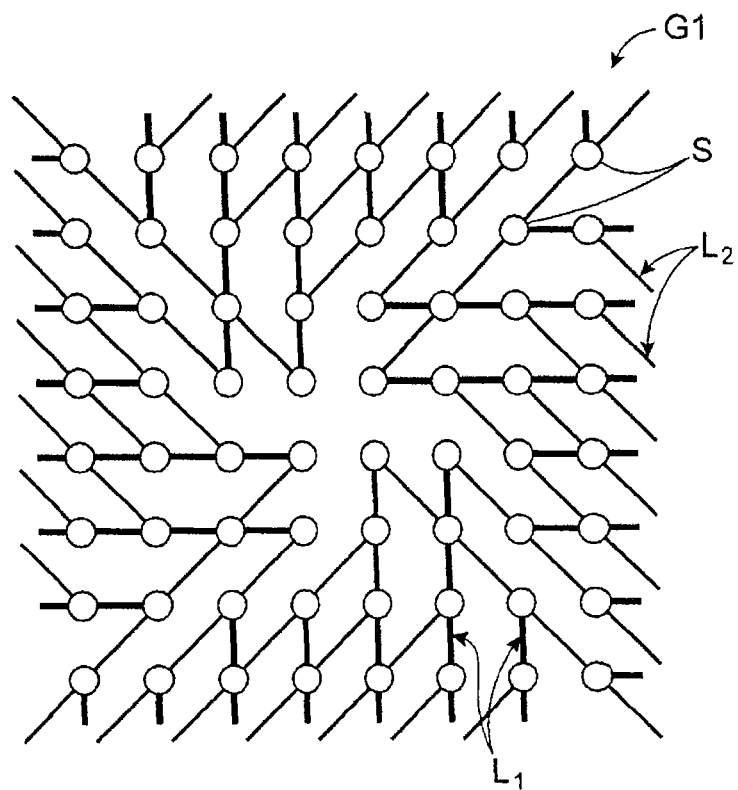
FIGS. 2A-2C illustrate steps of an exemplary designing method according to the invention of a matrix of photodetecting or photoemitting elements, using equivalent graphs.

In the exemplary graph G1 of FIG. 2A, the vertices S correspond to photodiodes, whereas the links L1 and L2 respectively correspond to connections of anodes of photodiodes, and connections of cathodes of photodiodes.

Using this first topology, conducting closed circuits of the matrix which are likely to conduct a current, in particular a spurious current especially when the matrix is accessed in reading mode are identified.

Figure 2B:
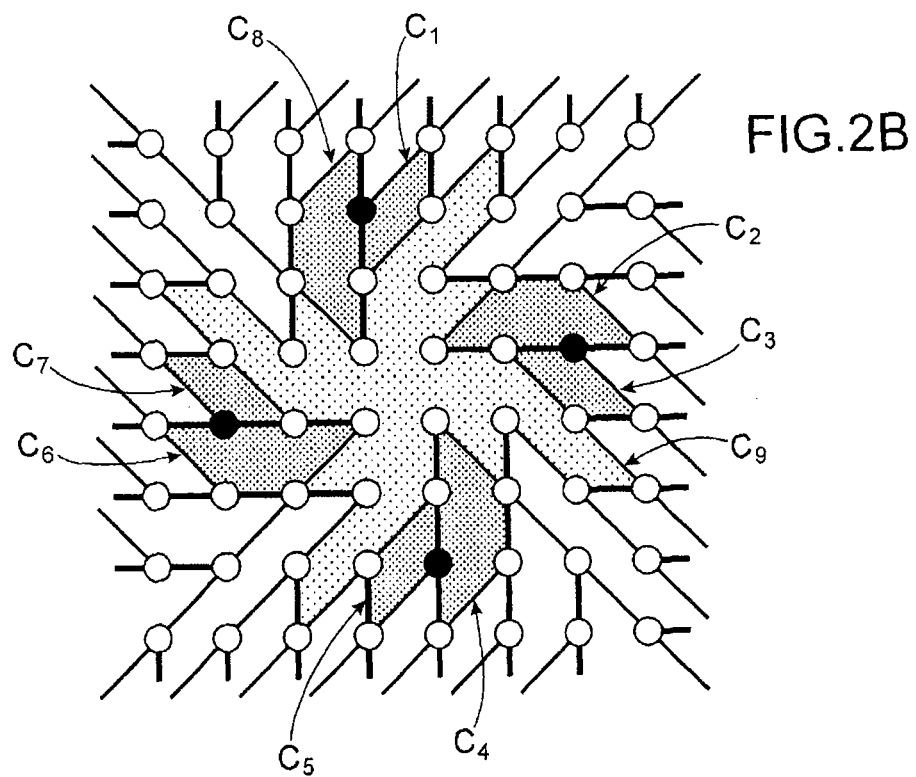

This identification can be made using an identification of cycles $C_1, C_2, C_3, C_4, C_5, C_6, \ldots, C_9$, of the graph G1, that is a series of consecutive links both end vertices of which are identical (FIG. 2B).

In one of said conducting circuits identified, or in several of said conducting circuits identified, or even in each conducting circuit identified, a selection of at least one photodetecting element is then performed.

In connection with the first graph G1, this step is to select in one of the cycles identified $C_1, \ldots, C_9$, or in several of said cycles identified $C_1, \ldots, C_9$, or even in each of the cycles identified $C_1, \ldots, C_9$, at least one given vertex.

Figure 2C:
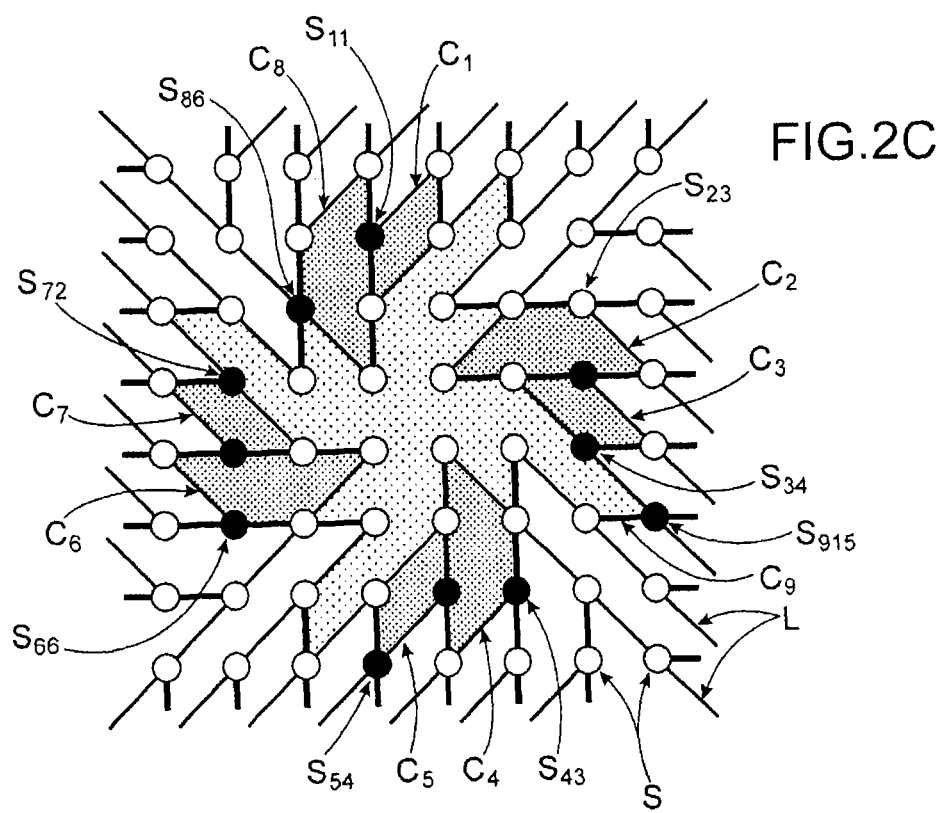

In the example of FIG. 2C, in each of the cycles identified $C_1, C_2, C_3, C_4, C_5, C_6, C_7, C_8, C_9$ of the graph, a vertex $S_{11}$, $S_{23}, S_{34}, S_{43}, S_{54}, S_{66}, S_{72}, S_{86}$ was selected.

One or more vertices can be also selected in the cycle(s) of the graph G1 having the highest length. The term "length" here corresponds to the total number of vertices of this cycle.

By performing this selection of vertex (vertices), one or several given photodetecting element(s) of the matrix device belonging to the greatest conducting closed circuit(s), in particular having a spurious conduction, is (are) determined.

In connection with the topology of a matrix of photodiodes, the cycles having the highest lengths correspond to the conducting circuits wherein the greatest number of photodiodes is located.

Figure 3:
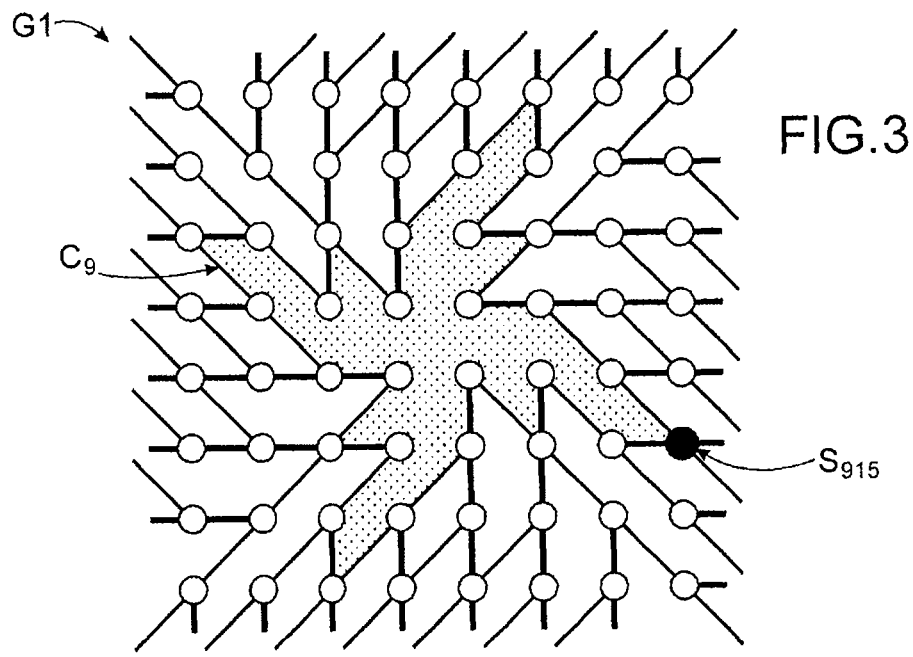
FIG. 3 illustrates a method for selecting photodetecting or photoemitting elements to be deactivated to form a matrix of photodetecting or photoemitting elements according to the invention using an equivalent graph.

In the example of FIG. 3, the vertex $S_{915}$ was selected in a cycle $C_9$ which was identified as the cycle of the graph G1 having the maximum length.

According to a possible implementation of this designing phase, one or more vertex (vertices) in the cycle(s) of the graph which has (have) a length higher than a predetermined length is (are) selected.

By this selection of vertex (vertices), one or more given photodetecting or photoemitting element(s) of the matrix device is (are) determined, which belong(s) to conducting closed circuits passing through a predetermined number of photodetecting elements.

Figure 4:
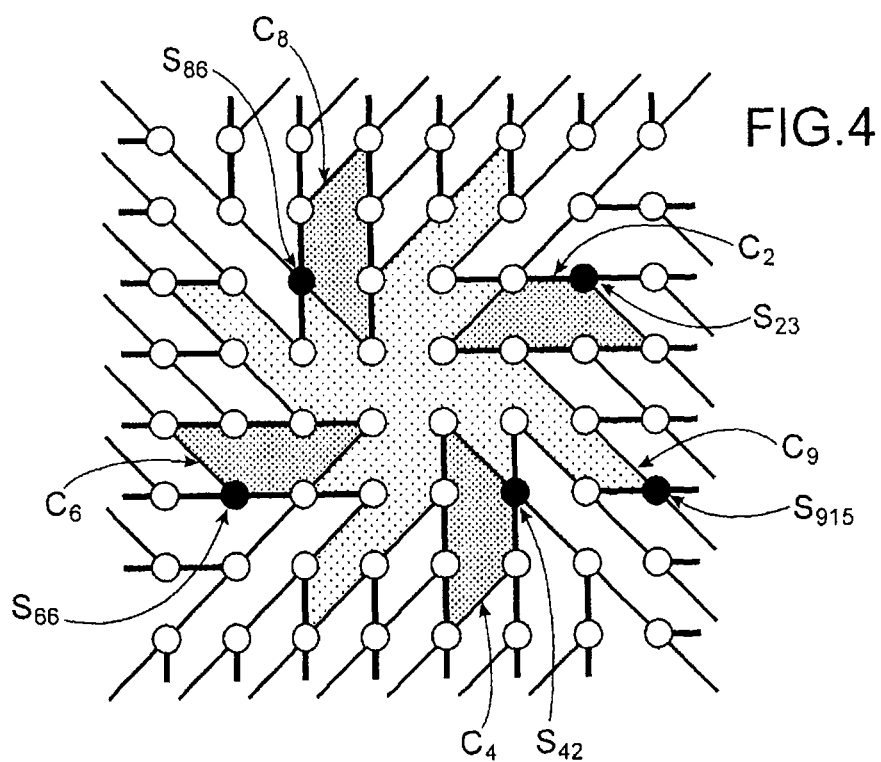
FIG. 4 illustrates an alternative method for selecting photodetecting or photoemitting elements to be deactivated to form a matrix of photodetecting or photoemitting elements according to the invention using an equivalent graph.

In the example of FIG. 4, vertices $S_{23}$, $S_{42}$, $S_{66}$, $S_{86}$, $S_{915}$ were selected in cycles identified $C_2$, $C_4$, $C_6$, $C_8$, $C_9$, having a length equal to or higher than a predetermined length of 5.

This vertex selection phase enable photodetecting elements of the matrix which are intended to be inactive or made inactive or be placed in high impedance in the matrix of photodetectors which is made to be determined.

At the end of the selection phase, each of the selected vertices corresponds to a photodetecting element which will be made inactive.

By "inactive", it is meant, in the case of photodetecting elements, that the function of these detecting elements is deactivated or removed or prevented and/or that they cannot participate in acquiring an image by the matrix.

According to one advantageous embodiment, vertices of the graph G1 which are common to several cycles, in particular which are common to 2 cycles of the graph are selected.

It is thus attempted to reduce as much as possible the number of spurious conducting circuits of the matrix while trying to minimize the number of photodetecting elements that are made inactive.

Figure 5:
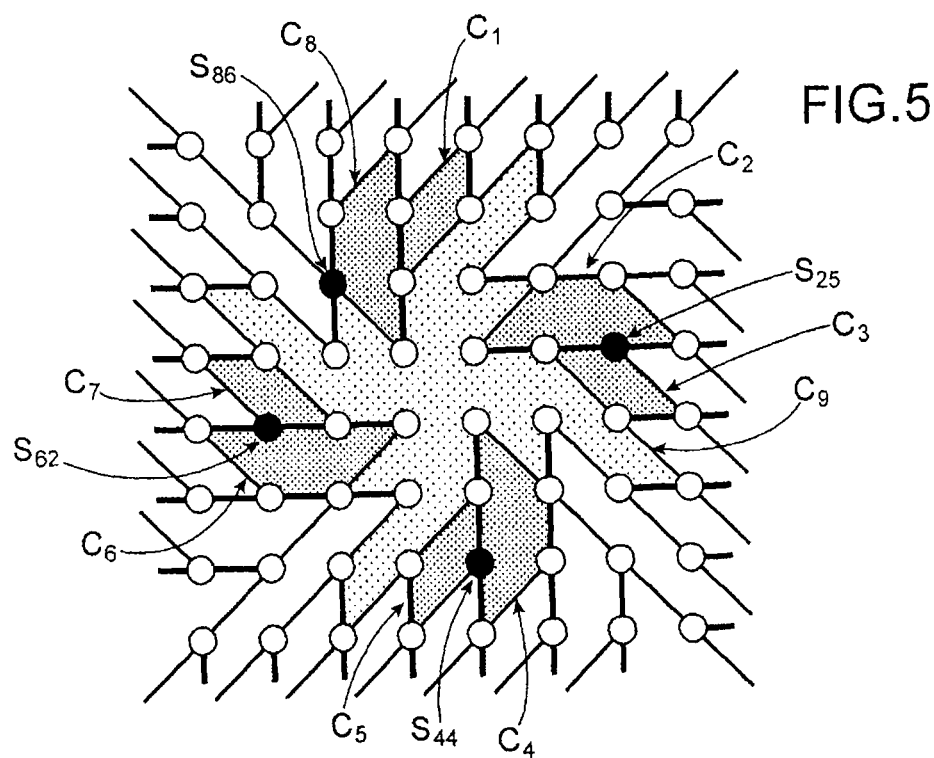
FIG. 5 illustrates another alternative of such a method for selecting photodetecting or photoemitting elements to be deactivated.

In the example of FIG. 5, vertices $S_{25}$, $S_{44}$, $S_{62}$, $S_{86}$ selected are respectively common to the pairs of cycles identified $C_2$ and $C_3$, $C_4$ and $C_5$, $C_6$ and $C_7$, $C_8$ and $C_9$.

The selection of vertices and thus of the pixel which will be made inactive can depend on how this pixel will be made inactive.

This selection mode of vertices common to two cycles can be combined with either of those described above, consisting in selecting vertices in cycles having a highest length or in cycles having a length higher than a predetermined length.

Figure 6:
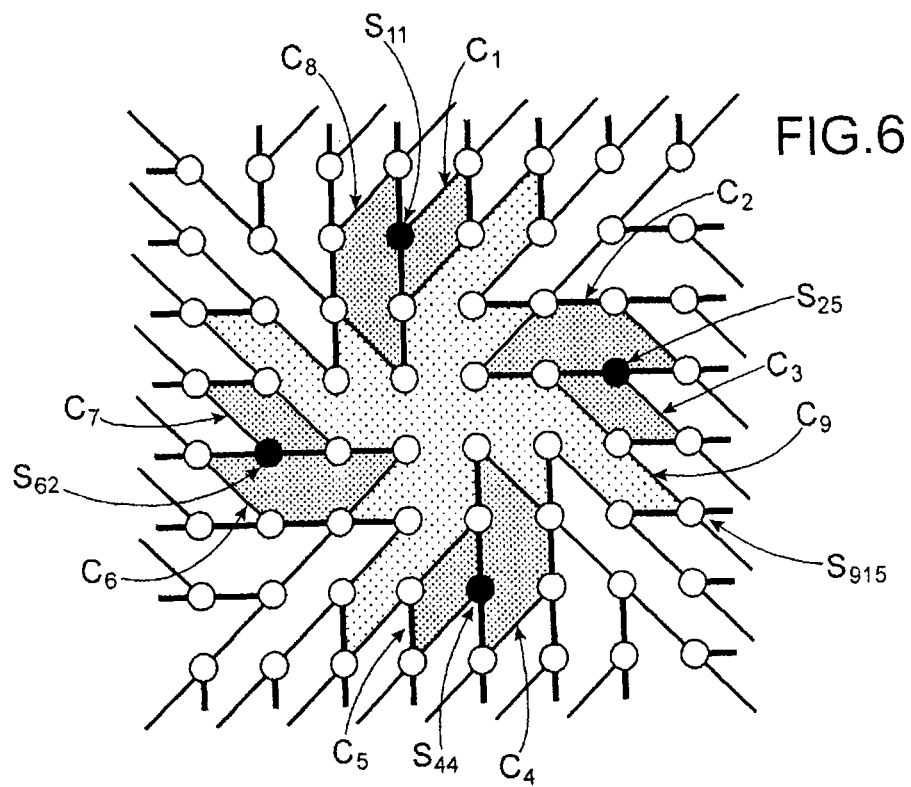
FIG. 6 illustrates another alternative method for selecting photodetecting or photoemitting elements to be deactivated.

In the example of FIG. 6, vertices $S_{11}$, $S_{25}$, $S_{44}$, $S_{62}$, were first selected because they are respectively common to the pairs of cycles identified $C_1$ and $C_8$, $C_2$ and $C_3$, $C_4$ and $C_5$, $C_6$ and $C_7$, whereas the vertex $S_{915}$ was in turn selected in the cycle $C_9$ identified with the maximum length. These 5 vertices selected correspond to 5 photodetecting elements which are intended to be made inactive in the matrix of photodetectors.

The selection of a given vertex of the graph can also be made such that when this vertex common to two cycles is selected and when the links appended thereto are removed, at least one of the cycles to which this vertex belongs is removed without creating a new cycle.

According to a possible implementation, the selection can be made only on some zones of the matrix, other given zones being excluded from this selection step. Thus, photodetecting elements belonging to these given zones are prevented from being made inactive.

The selection can be made such that the vertices selected have a homogeneous distribution or a distribution having a symmetry, which can enable in the following the processing of an image from the matrix to be facilitated.

This vertex selection step can also be implemented so as to minimize or nullify the number of adjacent or neighbouring or close selected vertices, that is remote by some distance lower than a predetermined distance.

The selection of a vertex can thus be conditioned as a function of a possible selection of its neighbours or the vertices adjacent thereto. The number of adjacent or neighbouring or close photodetecting elements which are made inactive in the matrix can thus be minimized.

According to a possible implementation, a new graph G2 can be formed from the first graph G1 wherein vertices were selected.

This new graph G2 can be formed from the first graph G1, by removing at least one link connected to each vertex selected from the first graph G1.

Figure 7A:
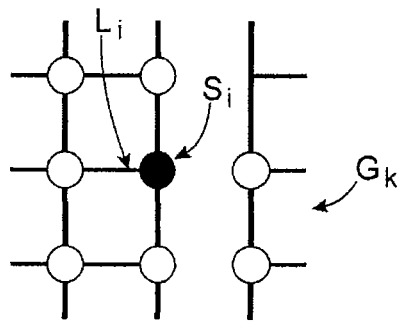
FIGS. 7A-7B illustrate a modification of an equivalent graph implemented during an exemplary designing method according to the invention.
Figure 7B:
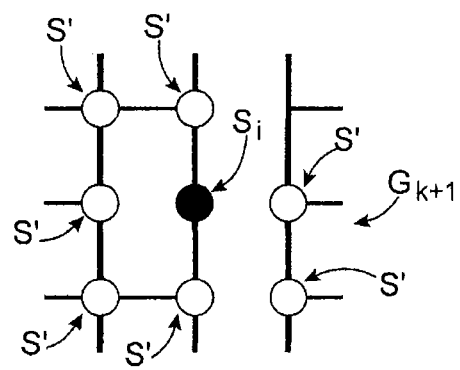

In FIGS. 7A-7B, an example of such a removal is illustrated.

Identification and selection processing such as described previously enabled a given vertex $S_i$ corresponding to a photodetecting element which is desired to be made inactive in a graph $G_k$ corresponding to a matrix of photodetectors (FIG. 7A) to be selected.

Then, a link $L_i$ connected to the vertex $S_i$ selected is removed so as to form a new graph $G_{k+1}$ (FIG. 7B). In this example, the link $L_i$ can be representative of an anode or cathode connection of the photodetecting element corresponding to the vertex $S_i$ selected. This link $L_i$ removed is preferably selected so as not to make inactive the photodetecting elements corresponding to the vertices S' neighbouring to the given vertex $S_i$ on the graph.

The steps of cycle identification and vertex selection can be reiterated in this new graph $G_{k+1}$.

An iterative method wherein identification and selection steps such as described above are implemented for example as long as cycles appear in the current graph.

Then, depending on the finally obtained graph and the vertices of this graph which were selected, said first topology is modified and a new topology is produced.

In this new topology, several photodetecting elements are made inactive or identified as intended to be made inactive.

This new topology $T_2$ or "layout" can be made by modifying the routing of the matrix according to said first topology $T_1$.

Thus, making a photodetecting element inactive within the new topology $T_2$ and then manufacturing the matrix by following this new topology $T_2$ can be provided.

According to another possibility, designating or identifying the photodetecting elements to be made inactive in a topology and then manufacturing the matrix by making said designed photodetecting elements inactive can be provided.

Figure 8:
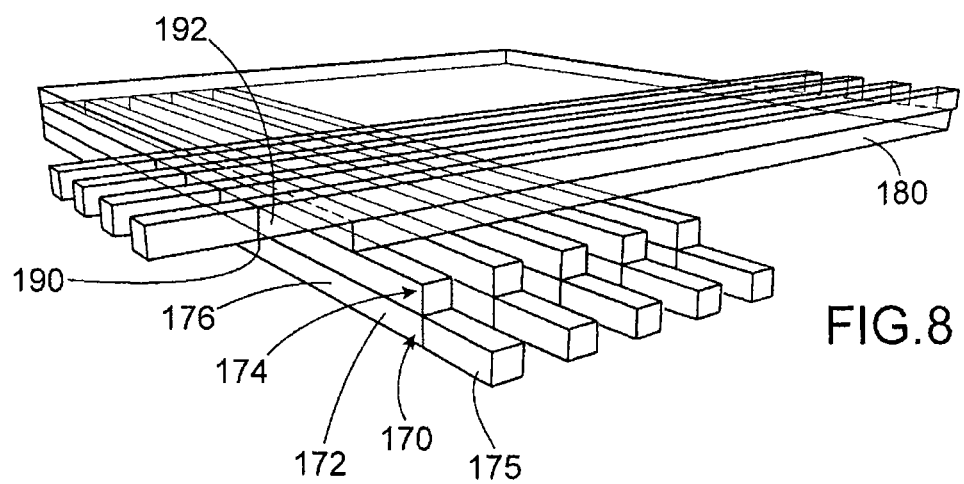
FIG. 8 illustrates a stack of layers wherein a matrix of organic photodiodes implemented according to the invention can be made.

The matrix made can be for example formed by photodetecting elements in the form of photodiodes based on an organic semi-conductor material and made from a stack of the type given in FIG. 8.

The anodes 170 of photodiodes are made in a layer based on a conducting and transparent material 172 such as ITO ("Indium Tin Oxide") and a layer 174 based on a material 176 such as Poly(3,4-ethylenedioxythiophene)poly(styrenesulfonate) commonly called PEDOT:PSS, enabling ohmic contact with a layer of organic semi-conductor material 180 to be promoted.

The patterns of the layer of conducting and transparent material 172, for example in the form of parallel bars, are superimposed with those formed in the layer of material 176 and can be identical to the same. Zones of metal contacts 175, for example based on TiAu, are formed at the ends of each anode 170.

The organic semi-conductor material 180, for example such as a heterojunction mixture of donor polymer, for example P3HT (poly(3-hexylthiophène), and acceptor polymer, for example PCBM (phenylC$_{66}$ butyric acid methyl ester) can be formed so as to cover all the anodes 170.

Cathodes 190, for example in the form of parallel bars, are provided on the layer of organic semi-conductor material 180. These cathodes 190 can be for example based on aluminium.

A photodetecting element in the form of a photodiode can for example be made inactive by removing any connection of its anode and/or its cathode, from the remainder of the matrix, by destructing the diode or masking the diode.

Figure 9A:
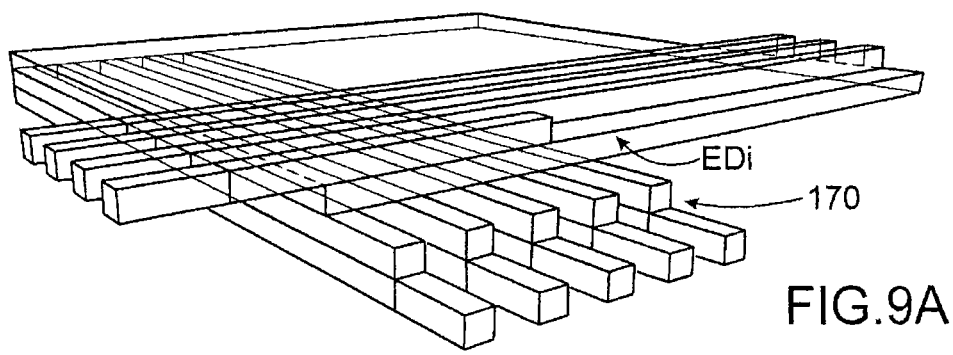
FIGS. 9A-9E illustrate different methods for making an organic photodiode inactive during the manufacture of a matrix of photodiodes according to the invention.

According to a first embodiment, in the example of FIG. 9A, an inactive photodetecting element Ed$_i$, formed in the stack previously described, includes an anode 170 and is free of cathode 190.

Figure 9B:
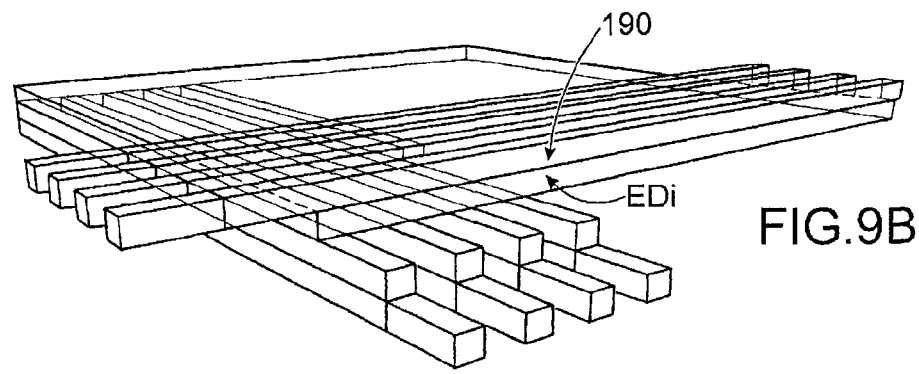

According to a second embodiment, in the example of FIG. 9B, an inactive photodetecting element Ed$_i$ formed in the stack previously described, includes a cathode 190 and is free of anode.

An alternative of these two embodiments consists in forming electric contacts of anode and/or cathode, for example by chemical etching so as to provide it with a high strength, for example having a high enough value for spurious currents to be in the order of dark current, for example lower than 1 nA.

Figure 9C:
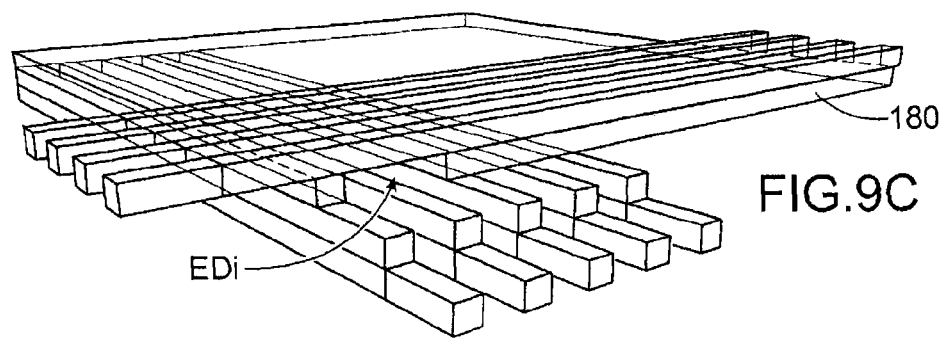

According to a third embodiment, another possibility (FIG. 9C) consists in providing an inactive photodetecting element Ed$_i$ without a detecting semi-conducting zone and possibly replaced by an insulating zone or with a deteriorated or destroyed detecting semi-conducting zone.

The deterioration or destruction can be made by physical treatment, for example using a laser beam or using UV radiation (FIG. 9E) or by chemical treatment, for example using a localised chemical etching during which the remainder of the device is protected by a mask.

Figure 9D:
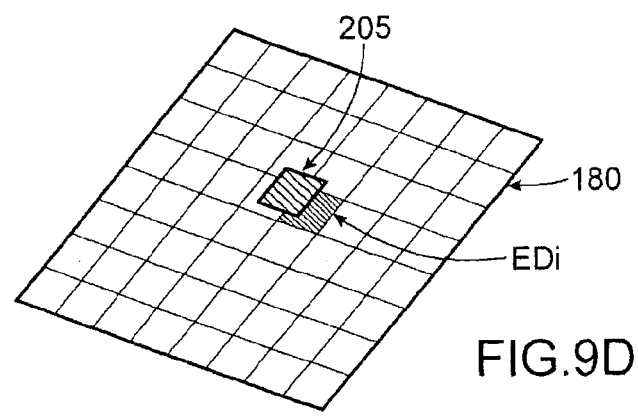
Figure 9E:
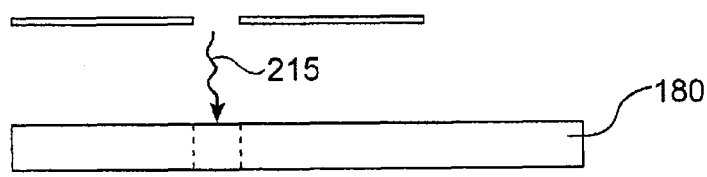

According to a first embodiment, another method for making a photodetecting element ED$_i$ inactive, consists in providing a mask 205 facing the semi-conducting zone 180 for detecting the same, the mask 202 being intended to block the radiation this semi-conducting zone 180 is likely to transform into electrons (FIG. 9D).

This mask can for example be made in the form of a metal strip or a plastic deposit. For example, in the case of a device formed by a stack such as described in connection with FIG. 2, this mask can be made by metal zones placed above the layer of semi-conductor material 180, in the places where the photodetecting diodes to be inactivated are provided.

The method which was previously described relates to the implementation of photodetectors, thus light receiving elements which transform incident photons into electrons.

This method is also applicable to the implementation of a matrix device formed by light emitting or photoemitting elements.

A matrix of light emitting diodes based on an organic semi-conducting material can in particular be implemented using the method described above.

In the case of photoemitting elements, by "inactive", it is meant that their emission function is deactivated or prevented and/or that they cannot participate in forming an image by the matrix.

Figure 10:
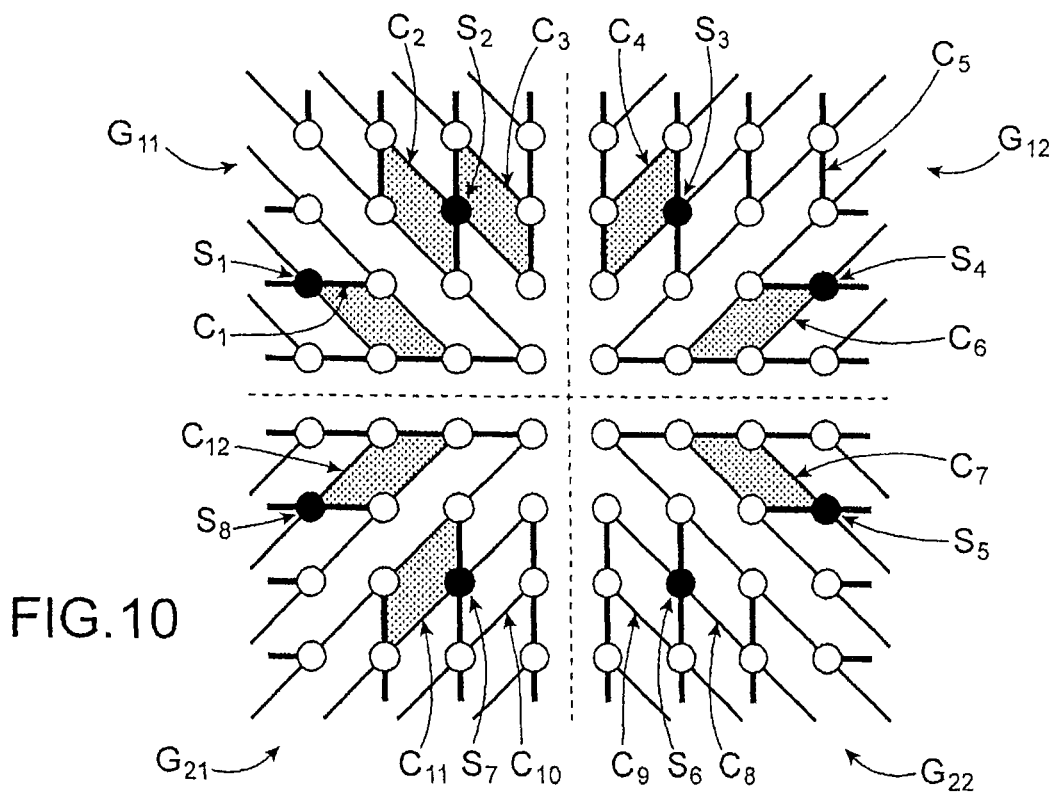
FIG. 10 illustrates an example of graphs implemented during a designing method of a matrix device according to the invention wherein the matrix is formed by several independent zones.

In FIG. 10, an alternative embodiment is given. A graph comprised of 4 subgraphs G11, G12, G21, G22 was formed from a topology of matrix of photodiodes comprising 4 juxtaposed but electrically independent zones.

In a first subgraph G11, vertices S1 and S2 respectively belonging to the cycle C$_1$, and to the pair of cycles C$_2$-C$_3$, were identified as corresponding to elements of the matrix which are to be made inactive.

In a second subgraph G12, vertices S4 and S3 respectively belonging to the cycle C$_6$, and to the pair of cycles C$_4$-C$_5$, were identified as corresponding to elements of the matrix which are to be made inactive.

In a third subgraph G22, these are the vertices S6 and S5 which are intended to be made inactive, whereas in a fourth subgraph G21, these are the vertices S7 and S8 which are selected and designated as intended to be made inactive.

Figure 11A:
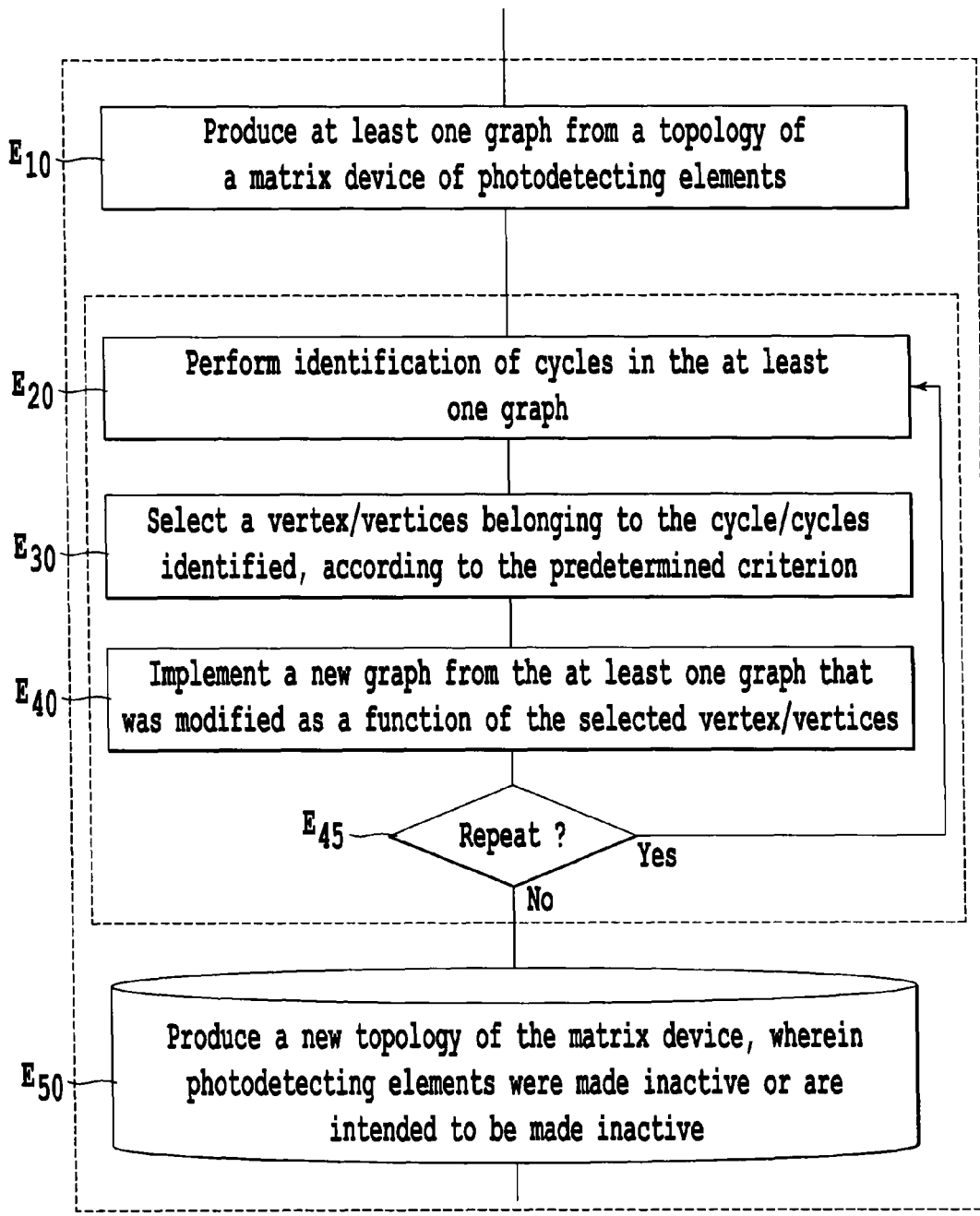
FIGS. 11A-11C illustrate a data processing system for implementing a designing method according to the invention.

FIG. 11A is a flowchart of a method for designing a matrix of photodetecting or photoemitting elements according to the invention, some previously described operations of which can be a part.

According to a first step, at least one graph is produced from a topology of a matrix device of photodetecting elements (step E10).

This first graph can be implemented using a data processing device including modelling means.

Thereafter, in this first graph G1, an identification of cycles is performed (step E20).

Then a selection of vertex (vertices) belonging to the cycles identified (step E30) is performed according to a predetermined criterion, for example by selecting vertices common to two cycles.

Then, a new graph can be implemented (step E40) from the first graph G1 that was modified as a function of the vertices selected, for example by removing one or more links connected to these selected vertices.

One or more iterations of the preceding steps can be possibly performed (step E45).

These steps E20, E30 and E40 can be made by a data processing device 400 or data processing means 400. Such a device can be provided with graph processing means implemented using algorithms, for example made on a Grin 4.8 and/or Matlab 9.2 type software.

A new topology (step E50) of the matrix device can then be produced, wherein photodetecting elements were made inactive or are identified as being intended to be made inactive.

Figure 11B:
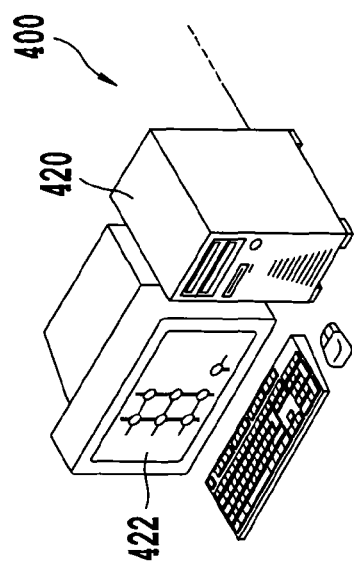
Figure 11C:
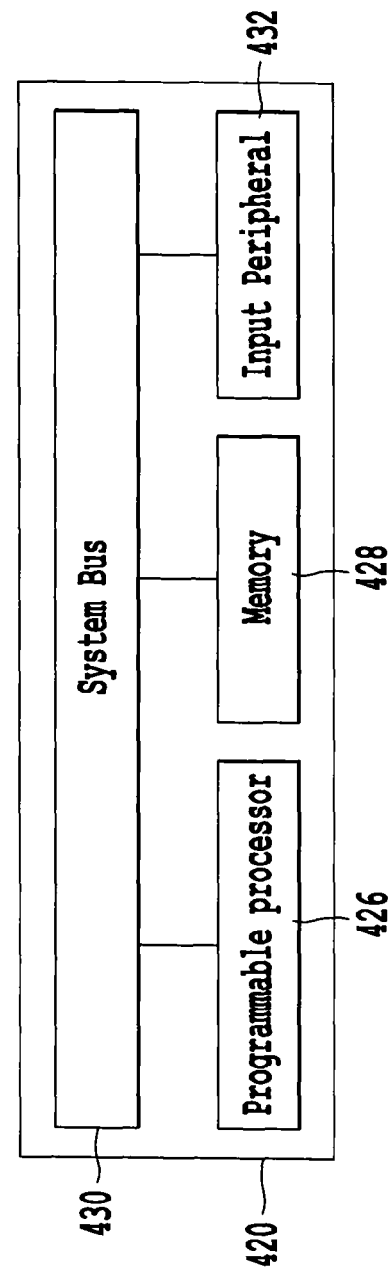

FIG. 11B represents a data processing device 400 provided with a computer 420 suitably configured to processing topologies or layout of electronic circuits.

The computer 420 includes a calculation section with all the electronic, software or the like components, required for making circuit topologies, for modelling a circuit topology as a graph, for processing graphs, or for calculations performed on graphs.

Thus, for example, the system includes a programmable processor 426, and at least one memory 428. The system can also include an input peripheral, for example a hard disk 432, coupled to a system bus 430. The processor can, for example, be a microprocessor or a central unit processor. The memory 428 can, for example, be a hard disk, a ROM, a compact disk, a DRAM or any other memory RAM, a magnetic or optical storing element, registers or other volatile and/or non-volatile memories. Graph processing algorithms can be stored in the memory, and enable processings such as described above to be performed on a graph obtained by modelling a circuit topology.

A program enabling the implementation of a designing method according to the invention is residing or recorded on a medium, for example a CD ROM or DVD ROM, or a removable hard disk, or any memory medium likely to be read by a data processing system.

The computer 420 can also be connected to other peripheral devices, such as for example a display device such as a screen 422.

It is thus possible to display on the screen 422 an image representative of a graph processing result, such as described previously or a new topology of matrix device wherein photodetecting or photoemitting elements were made inactive or are designated as intended to be made inactive.

The data processing device can be connected to a network, for example of the Internet type, enabling data of graphs and/or topologies of a matrix device to be sent to another remote device.

The invention claimed is:

1. A method for making a matrix device including a matrix of photodetecting or photoemitting elements, the method comprising designing operation using a data processing means for:
   a) identifying, using a computer, from at least one given topology of the matrix device, one or more electrically conducting closed circuits; and
   b) selecting, using the computer, at least one photodetecting or photoemitting element of the matrix device belonging to at least one of the conducting closed circuits identified,
   wherein the at least one element selected in b) of the matrix is made inactive or is identified as intended to be made inactive,
   wherein a) further comprises:
      a1) implementing, from the given topology, at least one graph formed by vertices corresponding to the at least one element of the matrix and links corresponding to connections of vertices in the matrix, and
      a2) identifying one or more given cycles in the graph, and
   wherein b) is performed by selecting at least one given vertex belonging to at least one of the cycles of the graph.

2. The method for making a matrix device according to claim 1, further comprising producing a new topology of the matrix device, by modifying routing of the at least one given topology of the matrix, based on the at least one element selected in b) that is made inactive or identified as intended to be made inactive.

3. The method for making a matrix device according to claim 2, wherein the given vertex selected is common to two cycles of the graph.

4. The method for making a matrix device according to claim 2, wherein the given vertex selected belongs to a cycle having a length larger than a predetermined length or belonging to a greatest cycle of the graph.

5. The method for making a matrix device according to claim 1, further comprising manufacturing the matrix device, the at least one element selected in b) being inactive.

6. The method for making a matrix device according to claim 1, wherein the at least one element selected is made inactive by providing at least one electrode disconnected from a remainder of the matrix.

7. The method for making a matrix device according to claim 1, wherein the elements of the matrix include a semi-conducting, photodetecting, or photon-emitting zone, the at least one element selected being made inactive by providing a masking zone facing the semi-conducting zone, the photodetecting zone, or the photon-emitting zone of the matrix.

8. The method for making a matrix device according to claim 1, wherein the at least one element made inactive or intended to be made inactive is provided without a photodetecting or photoemitting semi-conducting zone or with an insulating zone replacing the photodetecting or photoemitting zone.

9. The method for making a matrix device according to claim 1, wherein the at least one element selected is formed with a photodetecting or photoemitting semi-conducting zone, and is made inactive.

10. The method for making a matrix device according to claim 1, wherein the at least one element of the matrix is at least one organic semi-conductor diode.

11. A non-transitory computer readable storage medium encoded with computer program code instructions, which when executed, cause a computer to execute a method for making a matrix device including a matrix of photodetecting or photoemitting elements, the method comprising designing operation using a data processing means for:
   a) identifying, using the computer, from at least one given topology of the matrix device, one or more electrically conducting closed circuits; and
   b) selecting, using the computer, at least one photodetecting or photoemitting element of the matrix device belonging to at least one of the conducting closed circuits identified,
   wherein the at least one element selected in b) of the matrix is made inactive or is identified as intended to be made inactive,
   wherein a) further comprises:
      a1) implementing, from the given topology, at least one graph formed by vertices corresponding to the at least one element of the matrix and links corresponding to connections of vertices in the matrix, and
      a2) identifying one or more given cycles in the graph, and
   wherein b) is performed by selecting at least one given vertex belonging to at least one of the cycles of the graph.

* * * * *